(12) United States Patent
Andricacos et al.

(10) Patent No.: US 7,060,624 B2
(45) Date of Patent: Jun. 13, 2006

(54) DEEP FILLED VIAS

(75) Inventors: Panayotis Andricacos, Croton on Hudson, NY (US); Emanuel Israel Cooper, Scarsdale, NY (US); Timothy Joseph Dalton, Ridgefield, CT (US); Hariklia Deligianni, Tenafly, NJ (US); Daniel Guidotti, Atlanta, GA (US); Keith Thomas Kwietniak, Highland Falls, NY (US); Michelle Leigh Steen, Danbury, CT (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/639,989

(22) Filed: Aug. 13, 2003

(65) Prior Publication Data

US 2005/0037608 A1 Feb. 17, 2005

(51) Int. Cl.
*H01L 21/311* (2006.01)
(52) U.S. Cl. ..................................... 438/700; 438/704
(58) Field of Classification Search ........ 438/694–696, 438/700, 701, 704, 707, 710, 738, 713–715
See application file for complete search history.

(56) References Cited

U.S. PATENT DOCUMENTS

| | | | | |
|---|---|---|---|---|
| 3,986,912 A | 10/1976 | Alcorn et al. | ................. | 156/11 |
| 4,487,652 A | 12/1984 | Almgren | ..................... | 156/643 |
| 4,605,470 A | 8/1986 | Gwozdz | ..................... | 156/643 |
| 4,624,740 A | 11/1986 | Abrrams et al. | ............ | 156/643 |
| 4,814,041 A | 3/1989 | Auda | ........................ | 156/643 |
| 4,830,706 A | 5/1989 | Horwath et al. | ............ | 156/643 |
| 4,902,377 A | 2/1990 | Berglund et al. | ........... | 156/643 |
| 5,162,261 A | 11/1992 | Fuller et al. | ................. | 437/195 |
| 5,292,558 A | 3/1994 | Heller et al. | ................. | 427/533 |
| 5,308,415 A | 5/1994 | Chou | ......................... | 156/643 |
| 5,308,929 A | 5/1994 | Tani et al. | ................... | 174/262 |
| 5,354,386 A | 10/1994 | Cheung et al. | .............. | 148/33 |
| 5,501,893 A | 3/1996 | Laermer et al. | ............ | 428/161 |
| 5,658,472 A * | 8/1997 | Bartha et al. | .................. | 216/2 |
| 5,746,884 A | 5/1998 | Gupta et al. | ................ | 156/643 |
| 5,841,196 A | 11/1998 | Gupta et al. | ................ | 257/774 |
| 6,171,964 B1 | 1/2001 | Gonzalez et al. | ........... | 438/694 |
| 6,249,016 B1 | 6/2001 | Chaudhry et al. | .......... | 257/296 |
| 6,284,666 B1 * | 9/2001 | Naeem et al. | .............. | 438/713 |
| 6,287,963 B1 | 9/2001 | Chen et al. | ................. | 438/643 |
| 6,400,018 B1 | 6/2002 | Clatanoff et al. | ........... | 257/737 |

(Continued)

OTHER PUBLICATIONS

S. Aachboun & P. Ranson, Deep anisotropic etching of silicon, J. Vac. Sci. Technol.. A 17(4), Jul./Aug. 1999.

*Primary Examiner*—David Vu
(74) *Attorney, Agent, or Firm*—Robert M. Trepp; David Aker (57) ABSTRACT

Flared and non-flared metallized deep vias having aspect ratios of about 2 or greater are provided. Blind vias have been fabricated in silicon substrates up to a depth of about 300 microns, and flared through vias have been fabricated up to about 750 microns, the approximate thickness of a silicon substrate wafer, enabling the formation of electrical connections at either or both ends of a via.

In spite of the depth and high aspect ratios attainable, the etched vias are completely filled with plated copper conductor, completing the formation of deep vias and allowing fuller use of both sides of the substrate.

16 Claims, 4 Drawing Sheets

U.S. PATENT DOCUMENTS

| | | |
|---|---|---|
| 6,400,172 B1 | 6/2002 | Akram et al. ................ 324/765 |
| 6,433,301 B1 | 8/2002 | Dunsky et al. ......... 219/121.67 |
| 6,506,332 B1 | 1/2003 | Pedigo ....................... 264/443 |
| 6,522,304 B1 | 2/2003 | Ballantine et al. .......... 343/772 |

* cited by examiner

Mag = 264 X  20 μm    EHT = 10.00 kV
                      WD = 3 mm         FIG.4a

DEEP FILLED VIAS

BACKGROUND OF THE INVENTION

The present invention relates to the formation of metallized, high aspect ratio vias, in which the diameter of at least one of two ends of a via is preferably flared, the ends being connected by side walls therebetween. More particularly, the present invention relates to high aspect ratio plated conductive vias which are fabricated in the semiconductor substrate of a multichip module (MCM) or packaging structure. Other applications include, but are not limited to, micro-electromechanical systems (MEMs); micro-opto-electro-mechanical systems (MOEMs); RF MEMs; BioMEMs; lab-on-chip (LOC) and other sensors; and membranes.

Much work has been done in the integrated circuit (IC) art to address reliability problems in metallized vias attributed to poor metal coverage of via side walls, lower step coverage at angularities such as at via and wiring level intersections, metal flaking at stress points, and incomplete fill of metal within the via. Stresses caused by such irregularities contribute to electromigration problems, increased resistivity of the via, ultimately the electrical failure of the device and difficulty in obtaining reproducibly acceptable vias within a chip and from batch to batch.

Work directed at solving via fill and coverage problems has generally related to interlevel vias, i.e. conductive vias formed through a dielectric layer and providing an electrical connection between conductive levels of an IC structure, or to vias providing an electrical connection between conductive levels and devices which are either mounted or buried in the semiconductor substrate. Generally, the via metallization has comprised dry deposited aluminum, including aluminum which includes a fractional percent of copper, silicon or tin, or tungsten or a titanium-tungsten alloy. It would be desirable to use pure or nearly pure copper instead, since the choice of copper would provide lower resistivity. Resistivity limits signal speed.

It has long been recognized that sloping the via walls might resolve the problem of via failure due to inadequate fill and coverage within the via, as the conductor metal would be deposited over a smoother surface more available to the anisotropic, i.e. essentially vertical, dry deposition of metal within the vias. However, as the diameter of interlevel vias in ICs approach one micron ($\mu$m) or less and aspect ratios approach 1 or more, sloping alone does not provide consistently satisfactory coverage. In addition, since sloping involves widening at the via opening, it uses up valuable real estate and increases the pitch (i.e. distance between the center of one via and the nearest edge of the neighboring via).

Numerous structures and processes have been proposed in the art for fabricating interlevel slope-walled conductive vias in integrated circuit structures. Some of the approaches to solving the via coverage problem by sloping have included altering the dielectric material through which the vias are etched (e.g. U.S. Pat. Nos. 5,308,415; 4,830,706), altering the temperature of the etch reaction (e.g. U.S. Pat. Nos. 3,986,912; 6,171,964), altering the state, selecting layer materials of particular composition and relative thickness (e.g. U.S. Pat. Nos. 4,624,740; 4,487,652), altering composition or composition ratio of the etchant (e.g. U.S. Pat. Nos. 5,354,386; 4,814,041), perhaps in stages throughout the etch (e.g. U.S. Pat. Nos. 4,814,041; 5,746,884; 5,841,196; 4,902,377; 5,354,386), etching through an insulator (e.g. U.S. Pat. Nos. 5,162,261; 5,308,929), or by manipulating the position of the mask through which the via is exposed, or by first depositing in the via to fill up to 40% of the diameter a refractory metal that provides better subsequent coverage for the dry deposited aluminum, copper, etc. (U.S. Pat. No. 6,171,964 B1).

Techniques in the art are described generally as producing sloping at an angle chosen between 45° and 70° to the lateral. Some slopes are continuous from top to bottom of the via; some are located only at the via opening. Vias are filled with a wide variety of materials which are inserted in many ways into vias of many dimensions. Vias may be mechanically drilled, dry and/or wet etched, or laser drilled (e.g. U.S. Pat. Nos. 6,433,301; 6,400,172 B1). For example the '172 patent describes using laser drilling to shape slopes at either or both ends of through-vias in a substrate such as silicon for test purposes. Slope openings are 10 $\mu$m wide or more. The vias are filled with a variety of metals and alloys or conductive polymer, and dry deposited or electrolessly plated. The '301 patent describes laser-shaped blind and through-vias having diameters of 5 to 300 $\mu$M formed through at least two types of layers, e.g. copper and organic dielectric, in a package or MCM.

In U.S. Pat. No. 6,506,332 B2 it is stated that the industry struggles to fill 6:1 aspect ratio (depth:diameter) vias, and describes filling, with paste under pressure, vias of aspect ratios between 1:1 and 17:1, in which vias can be as narrow as between 2 and 25 thousandths of an inch. Since this range of via diameter converts to 3 to 38 $\mu$m, the depth would be 3 to 646 $\mu$m for that range of aspect ratio. The filling is a fail-safe performed after brief plating to compensate for the plating discontinuities taken for granted to be present at high aspect ratios. In the present invention, a method is provided to obtain deep via, voidless metallization coverage and fill.

Sloped interlevel vias have become viewed as less desirable as IC features have become smaller and denser, and slope width uses up valuable real estate. U.S. Pat. No. 5,292,558 describes a way of avoiding or reducing sloped walls in vias of one $\mu$m or less by wetting the unfilled interior of a via with an adherent, optionally photosensitive, hydrophilic polymer-polyoxometalate solution to improve coverage in the subsequent deposition of metal, including copper and, even in steep walled vias. It is stated therein that producing noble interconnection film using organic ligand-bound metal atoms and ions by selective heating is known, but that the method described therein has the advantage of not requiring as high a temperature and of being able to foster the deposition of a prime coat, preferably of Mo or W, which have the added advantage of acting as a diffusion barrier between silicon and the metal fill. In the present invention fluted vias are acceptable because real estate is not as critical a consideration.

A number of organo-halide plasma etchants are known. For example, U.S. Pat. No. 5,501,893 describes steps of anisotropic etching of silicon through a mask using a plasma mix of sulfur hexafluoride ($SF_2$) and argon, which removes polymer, alternating with a polymerization etch stop step using a plasma mix of trifluoromethane ($CHF_3$) and argon, the silicon in this exothermic process being cooled in helium or by adhesion to silicon electrodes. The alternation of etch and polymerization steps is stated to produce vertical vias. Although the temperature is not specified in the '893 patent, the Bosch process described therein is used at substrate temperature at or about room temperature.

While the present invention involves filled via fabrication, it is directed to deep, or ultradeep, vias preferably in or through silicon-containing material, such as comprises semiconducting substrates, rather than to interlevel vias formed through dielectric layers to connect conductive lines within the multilevel superstructure. The present invention involves etching and polymerizing under cooling, the goal of which is to create deep vias that have voidless plating coverage and fill. The vias of the present invention allow for electrical and/or thermal contact to the power chip through the package. An alternative would be to thin the wafer and create shallow vias that can be metallized for interconnection. However, thinned wafers are difficult to handle (break easily). In using deep vias, i.e. about or above 100 µm thick, the package, being thicker, is more mechanically stable for ease of handling.

Following the fabrication of deep vias, the issue becomes how to metallize the deep via. It was originally expected that electroplating would be rather straightforward, based on experience in metallizing much smaller vias having about 1 µm diameter and about 6 µm depth. However, enormous difficulty was unexpectedly encountered at first in filling the deep vias, and void-free continuous plating of the deep vias was not achieved by means used to plate the shallower vias.

In the present invention, deep high aspect ratio filled vias are fabricated in a material including, but not limited to, silicon; silicon monoxide; silicon dioxide; silicon nitride; polysilicon; quartz; glass; silicates; silicon germanium; and gallium arsenide. Presumably, the fabrication process would be applicable to any material susceptible to the etchant. The option of fabricating vias having only straight walls is selected should ease of achieving conservation of surface real estate be desired more under the circumstances than assurance of total plating coverage and fill. The option of fabricating vias having fluted walls, i.e. walls sloped at at least one via opening, is selected when ease of achieving total plating coverage and fill is desired more under the circumstances than is conservation of surface real estate. The flared-opening fluted vias are generally easier to fill completely.

Fluted walls are provided in a controlled fashion using a fluoride-containing etchant, and are reproducible within less than about 5% variation, usually within about 1–2%, from wafer to wafer and from center to edge. Whereas angles of slope described in the art were preferred to be between about 45 and about 70 degrees, voidless filled vias and complete wall coverage is obtained in the present invention in a via having a slope angled as low as about 3° to the vertical axis (i.e. about 87° to lateral) in vias having an aspect ratio of greater than about 2 and as high as about 35.

Despite the work reported in the field of via fabrication, the need remains for the unique combination of elements and processes set forth in the present invention.

SUMMARY OF THE INVENTION

The present invention is directed to filled deep conductive vias, and the process of making filled deep conductive vias, in which the aspect ratio is greater than about 2. Although equivalent aspect ratios have been successfully electroplated in vias having smaller dimensions, the high aspect ratios seen for voidless copper plated vias of the present invention have not been fabricated heretofore for such depths nor under the same process conditions. The upper limit of the aspect ratio in a blind via is dependent only on the thickness of the material within which the via is to be situated and the amount of material required to remain below the via in order to maintain structural integrity. Blind vias having an aspect ratio of about 6 have been fabricated in silicon and reliably filled to a depth up to about 300 µm. Through-vias having two ends, at least one of which is flared, have also been fabricated in silicon. The silicon material comprises wafers which are typically between about 725 and about 750 µm thick. The vias of the present invention enable electrical contacts to be made at one or both ends of the vias. The deep filled via structure and process is also applicable for alternate materials and thickness which can be etched with either fluorine-, chlorine-, or bromine-based plasmas and plated compatibly with the techniques of the present invention.

DETAILED DESCRIPTION OF THE INVENTION

In order to facilitate understanding of the present invention, reference is made to the following detailed description taken in conjunction with FIGS. 1a–4c.

Fabricating Deep Vias

Figure 3A:
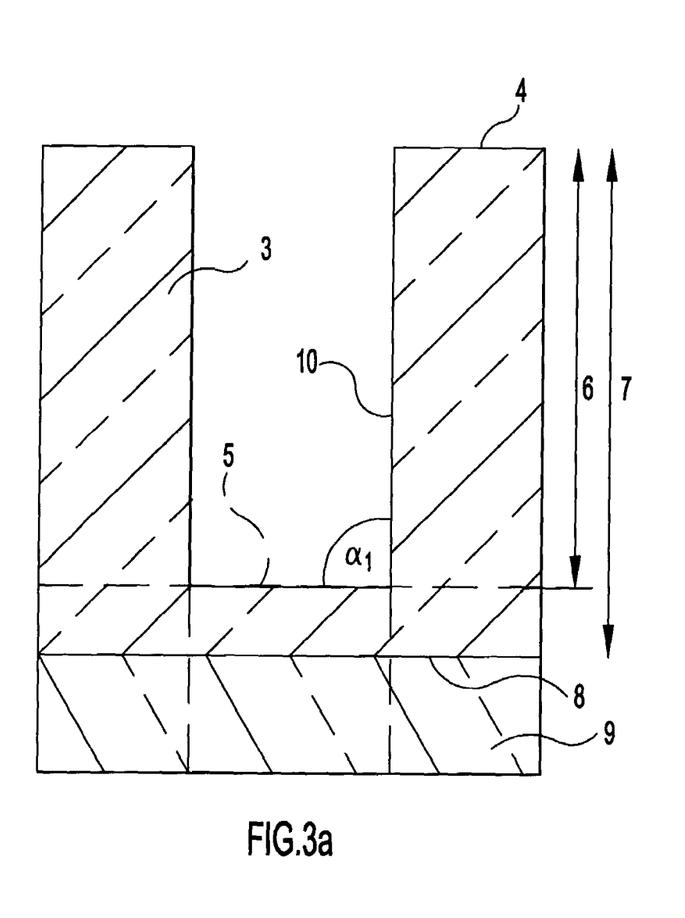
FIG. 3a represents in cross section the profile of a blind via within a substrate prior to flare fabrication, or as may be selected to remain unflared.

In FIGS. 1a–1e and 3a, sequences for forming a filled blind via structure are depicted. In FIG. 3a, an unflared deep via structure option is shown, and in FIG. 3b a preferred flared deep via structure option is shown. The vias, shown in the 2-dimensional drawings as U-shaped, are formed within material 3, which typically comprises silicon. Deep vias in FIGS. 3a and 3b extend from an upper surface 4 of material 3 down to bottom surface 5, a via depth of 6. In the presently preferred embodiment, depth 6 is between about 100 µm and about 300 µm, and more preferably is about 200 µm. Most preferably, vias in FIGS. 3a and 3b may extend through the entire vertical thickness 7 of material 3 to lower surface 8 of material 3, which is interfaced with the upper surface of substrate material 9. Material 9 is commonly $SiO_2$ but could be nitride, polymer, metal, or the like. Notably, the present invention is not limited in application to deep blind vias or to deep through-holes but includes other structures apparent to those skilled in the art such as lines, octagons, and spiral inductors—that is, any shape that can be etched and filled as described in the present invention.

The unflared via structure in FIG. 3a is defined by side walls 10. Side wall 10 forms an angle $\alpha_1$ with line 5, which is parallel to upper surface 4 of material 3. In the presently preferred embodiment, $\alpha_1$ is between about 88° and about 92° and more preferably about 90°.

Figure 3B:
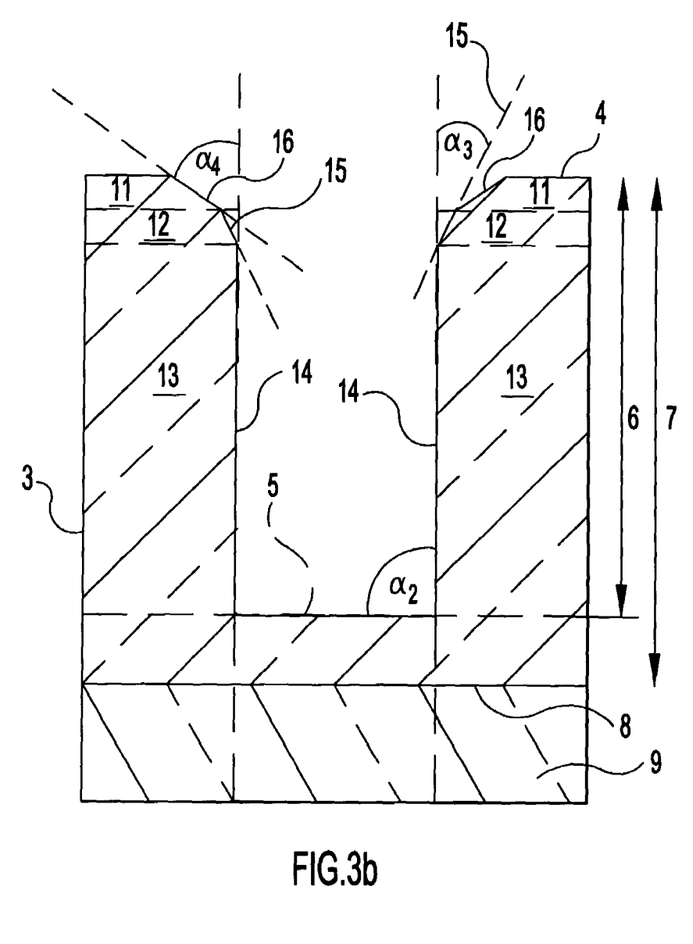
FIG. 3b represents in cross section the profile of a blind via within a substrate subsequent to flare fabrication.

The flared via structure in FIG. 3b includes upper region 11, intermediate region 12, and lower region 13, all of which are comprised of material 3. Lower region 13 is defined by side wall 14. Side wall 14 forms an angle $\alpha_2$ with bottom surface line 5, which is parallel to upper surface 4 of material 3. In the presently preferred embodiment, $\alpha_2$ is between about 88° and about 92° and more preferably about 90°. Intermediate region 12 of the flared via structure shown in FIG. 3b is defined by side wall 15. Side wall 15 extends from an upper portion of region 13 and forms an angle $\alpha$ with side wall 14 as extrapolated. In the presently preferred embodiment, $\alpha_3$ is between about 1° and about 4° and more preferably about 3°. The flared via structure in FIG. 3b further includes upper region 11 defined by side wall 16 as extrapolated. Side wall 16 extends from an upper portion of intermediate region 12 and forms an angle $\alpha_4$ with side wall 14. In the presently preferred embodiment, $\alpha_4$ is between about 4° and about 6° to vertical, and more preferably about 5°. Note that both $\alpha_3$ (measured relative to lower part 15 of the flare) and $\alpha_4$ (measured relative to upper part 16 of the flare) are part of the single flare shown, but are separately described for clarity. By integrating the three distinct side wall profiles of the lower region 13, intermediate region 12, and upper region 11, the flared via structure achieves a substantially continuous and gradually sloping profile. In a presently preferred embodiment, upper region 11 and intermediate region 12 together comprise between about 10 µm and about 50 µm of the vertical depth 6 of the flared structure. More preferably, upper region 11 and intermediate region 13 comprise about 30 µm of the vertical depth 6 of the flared structure.

Figure 1A:
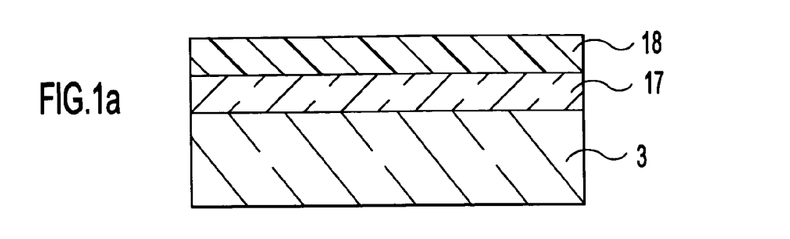
FIGS. 1a–1e show in cross section steps in forming the structures shown in FIGS. 3a and 3b.
Figure 1B:
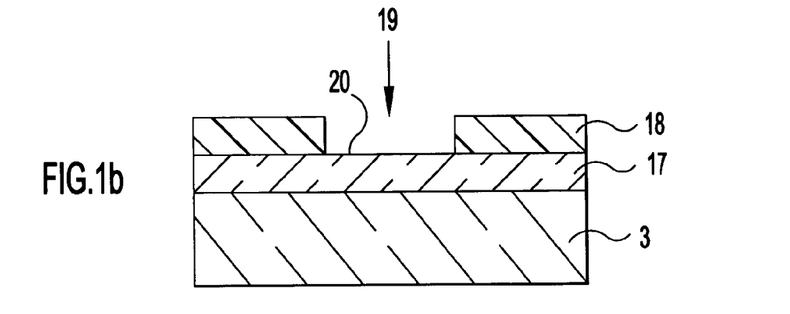
Figure 1C:
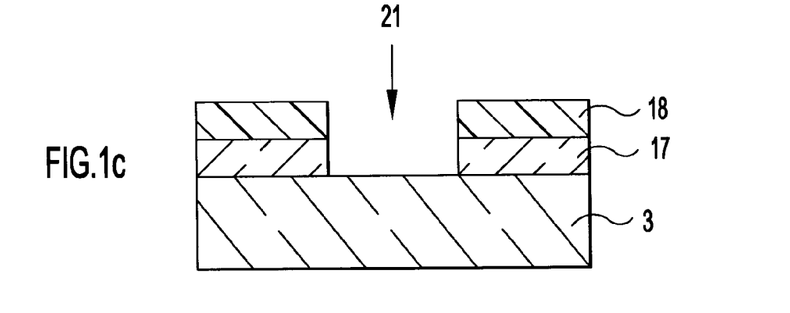
Figure 1D:
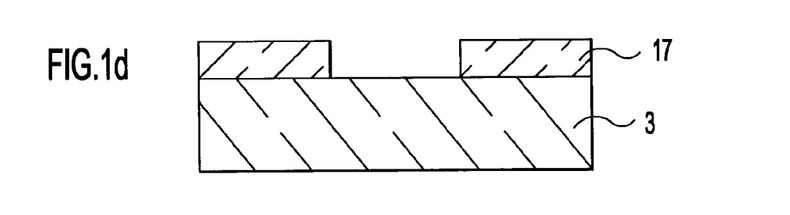
Figure 1E:
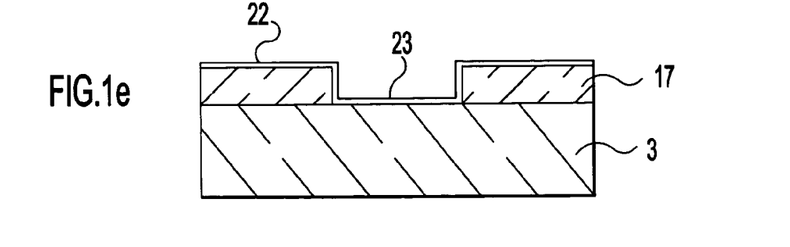

In FIGS. 1a–1e are found the process steps for forming the unflared structure shown in FIG. 3a and the initial steps for forming the flared structure shown in FIG. 3b. In FIG. 1a, a masking layer 17, normally a silicon oxide material, is formed upon material 3 and is patterned using conventional lithographic techniques. In an exemplary embodiment, masking layer 17 comprises an oxide formed by a plasma-enhanced chemical vapor deposition (CVD) process with a tetraethyl orthosilicate tetraethyl (TEOS) source, as known in the art. Next, photoresist layer 18 is deposited and cured upon oxide masking layer 17 using conventional photoresist processing techniques. In FIG. 1b, photoresist layer 18 is patterned, preferably with an optical aligner and a photo mask, and is exposed and developed in contact region 20 of masking layer 17 to create opening 19 in photoresist layer 18. Next, in FIG. 1c, the same pattern is transferred into masking layer 17 by exposing contact region 20 preferably to a dry etching process to create opening 21. Then, in FIG. 1d, resist 18 is stripped from masking layer 17 using conventional photoresist processing techniques.

A deep reactive ion etching method (RIE) is used to transfer the features laterally-defined by masking layer 17 into material 3. In the presently preferred embodiment, material 3 comprises silicon such that pattern transfer is accomplished using silicon etching by fluorine radicals generated in a plasma, as is known in the art. Such deep silicon structures can be fabricated using commercially available deep RIE systems such as the A601E, available from Alcatel. The deep RIE method uses time-multiplexed deep etching (TMDE), a variation of side wall passivation, wherein deposition and etching cycles are performed alternately. In TMDE, one cycles between deposition and etching many times until the target depth is reached. During the deposition step, side walls are passivated by a polymer 22, shown in FIG. 1e, deposited from a plasma formed from the deposition precursor. During the subsequent etching cycle, both the polymer and the silicon are preferentially etched from bottom 23 of the trench by ion bombardment. By switching between etching and deposition cycles, deep anisotropic structures having vertical side walls can be realized with very high etching rates in silicon substrates. A problem with the foregoing process is the degree of lateral etching inherent to TMDE, as is known in the art. In particular, fluorine radicals generated in the plasma have such a high spontaneous reaction rate that the lateral surfaces of the structure are etched quickly, thus resulting in undesired undercutting of the masking layer 17, scalloping of the vertical side walls, and roughening of surfaces exposed to the etchant. The mask undercutting and side wall scalloping are more apparent during the beginning of the etch process as the protective polymer coating on the side walls is thin during the first few deposition cycles. Furthermore, polymer covering of the side walls decreases rapidly at greater depths and lateral etching increases there to form undesirable bowed or barreled etch profiles. In addition, the polymer covering of the side walls can be adversely affected by the high heat of reaction associated with fluorine-containing plasma etching of silicon. The local heat generated at the silicon substrate surface during etching can cause the sidewall-protecting polymer to decrease. This effect appears to worsen with high silicon etching rates such as at about 10 µm/min. As a result, mask undercutting along with scalloping and bowing of the vertical side walls are exacerbated by the aggressive conditions used to produce appreciable silicon etching rates and by the heat generated during etching. Less aggressive conditions, such as lower $SF_6$ flows (e.g. about 300 sccm vs. about 750 sccm), shorter time for the etch step (e.g. about 3.5 seconds vs. about 9 seconds), lower process pressure (e.g. about 35 mTorr vs. about 70 mTorr), lower source power (e.g. about 1500 W vs. about 2000 W), and lower substrate bias (e.g. about 110 W vs. about 200 W), can be used to reduce, although not eliminate, deleterious profile traits with a significant tradeoff in silicon etching rate.

It is especially important to control the degree of scalloping, undercut, roughness, and bowing of etched profiles for fill applications having strict requirements on surface morphology and condition. Generally speaking, the more anisotropic the etch profile (i.e., the less lateral etching), the more accurate the fill.

In the presently preferred embodiment, deep silicon etching was accomplished using an etch cycle flowing $SF_6$ and a deposition cycle flowing $C_4F_8$, the industry having adopted $C_4F_8$ as the polymer-former of choice. Typically, processes have used etchant flows between about 300 sccm and about 900 sccm and more preferably about 750 sccm. Passivation flows were between about 50 sccm and about 150 sccm and more preferably about 110 sccm. The duration of the etch cycle was between about 3 seconds and about 12 seconds and more preferably about 9 seconds. The duration of the deposition cycle was between about 1 second and about 4 seconds and more preferably about 2.5 seconds. The chamber pressure tanged between about 5 mTorr to about 15 mTorr during the deposition step and more preferrably between 8 mTorr and about 12 mTorr. The chamber pressure ranged between about 35 mTorr to about 85 mTorr during the etching step and more preferrably between about 55 mTorr and about 75 mTorr. Power was independently applied to the ICP source and bias generators. The applied source power was between about 1000 W and about 3000 W and more preferably about 2000 W. Substrate bias ranged between 50 V and about 225 V and more preferably about 200 V.

The etch conditions described above are used to prepare deep vias in silicon structures. It should be noted that the art describes TMDE with substrate temperatures approximately equal to room temperature known as the Bosch method for creating deep vias. Alternatively, the art describes deep, cryogenic etching of silicon wherein etching is continuous (i.e., no alternating deposition and etch steps). A thin side wall-blocking layer is formed as a result of the reduced volatility of the etch products at cryogenic temperatures (e.g., <100° C.). However, the silicon etch rates are significantly lower than deep RIE at room temperature and the profile morphology is difficult to control.

The present invention uses TMDE and low substrate temperature to overcome the shortcomings of the art. As in deep cryogenic etching of silicon, the present invention uses liquid nitrogen cooling to achieve lower substrate temperatures. In the present invention, low substrate temperature is advantageous for several reasons. First, the polymer covering is increased at low substrate temperature, protecting the side wall from lateral etching and reducing undercutting and scalloping. More preferably, the thick polymer covering protects the side wall at greater depths, reducing the degree of side wall bowing. Second, low substrate temperature counteracts the heat generated during etching to maintain passivation. Third, the etch rate of masking layer 17 is decreased at low substrate temperature while the silicon etch rate is slightly higher. The difference in etch rates of the two yield about a 4× improvement in selectivity. For example, if a $SiO_2$ mask etch rate is 0.01 μm/min and Si etch rate is 10 μm/min, this would correspond to a $Si:SiO_2$ selectivity of 1000:1. Finally, the thick polymer layer can dramatically affect the profile shape, serving as a mold for the progressive etch front. Hence, the shape of the profile (straight vertical vs. flared structure) can be tailored by controlling the deposition and subsequent removal of the passivating polymer layer. Preferably, the side wall slope can be controlled to between about 88.5° and about 90° to lateral, depending on the degree and duration of substrate biasing at low substrate temperature.

A continuous and vertical side wall structure of unflared the structure shown in FIG. 3a was achieved using a substrate temperature between about 0° C. and about –100° C. and more preferably about –50° C. Furthermore, a constant substrate bias was applied during formation in order to achieve a vertical side wall structure. The substrate bias was between about 180 V and about 225 V and more preferably about 200 V. Such a relatively high substrate bias provides high directionality of ion bombardment, preferentially removing the polymer layer from the bottom of the structure and leaving a thick polymer layer to protect the side walls. Hence, a highly anisotropic structure is achieved. In the present invention the package is passive, i.e. no active devices or existing metallization layers are present.

The benefits of TMDE using low substrate temperature can be gleaned by comparing the low-temperature process to the room-temperature process using the same etch conditions (e.g., gas flows, step duration, source/bias powers, and pressure). The room-temperature process produces barreled and rough side wall profiles. The mask undercut is about 2.5 μm on either side of the mask opening. In comparison, the low-temperature process produces a vertical side wall structure. The mask undercut is reduced to about 1 μm or less on either side of the mask opening. In addition, there is a fourfold increase in mask selectivity. As stated above, $Si:SiO_2$ selectivities of about 1000:1 were obtained with low substrate temperature cryogenic TMDE vs. selectivities ranging from 100:1 to 250:1 with the room-temperature TMDE. Furthermore, an increase in the silicon etch rate of about 1 μm/min is obtained. Hence, low-temperature TMDE offers a preferable method for fabricating deep blind vias and deep through-vias.

The flared structure shown in FIG. 3b was also accomplished using a substrate temperature between about 0° C. and about –100° C. and more preferably about –50° C. Upper region 11 and intermediate region 12 of the flared structure in FIG. 3b were formed by a staged etch process. In one embodiment, the substrate bias was ramped during the deep RIE process from about 50 V to about 225 V and more preferably from about 130 V to about 180 V. In the first stage, the polymer removal rate from the side walls is higher than the second etch stage using higher substrate bias. As a result, the side wall deviated from 90° in the upper region 11 and intermediate region 12 of the side wall structure. In the second stage, the directionality of the etch was increased, resulting in a vertical side wall structure for lower region 13. In this way, ramping the substrate bias in combination with low-temperature TMDE accomplished the continuous and gradually sloping side wall structure of the flared structure shown in FIG. 3b.

In a preferred embodiment, the staged etch process used to fabricate the flared structure in FIG. 3b was a combination of dry and wet etching methods. First, the structure shown FIG. 3a was fabricated as described above. Then, polymer 22 layer covering masking layer 17 and surface 23 of the etched structure shown in FIG. 1e was removed using a dry etching method (i.e. oxygen ashing), as is known in the art Next, a wet etching method was used to create $α_3$ and $α_4$ of the flared structure shown in FIG. 3b. Such an etch process can be accomplished using the apparatus shown schematically in FIG. 2a. In the presently preferred embodiment, fresh silicon surfaces are exposed by the ashing step and laterally etched by spontaneous dissolution in a $HF:HNO_3:H_2O$ solution or by electrolytic anodic dissolution in an $HF:H_2O$ solution. In the former solution the concentration of HF can range between about 0.5–10 wt %; the nitric acid solution concentration can range between about 20–70 wt %. In preferred practice about 3.8 wt % HF and about 65 wt % $HNO_3$ were used based on initial concentrations of 50 wt % and 70 wt %, respectively. A more concentrated HF may attack the mask and reduce the flaring effect; a more dilute $HNO_3$ will have little oxidative power. The speed of reaction was found to be optimal under these conditions after two minutes at room temperature with agitation. A thermal oxide hardmask of about 2 μm protects areas of the wafer that should not be etched. The thermal oxide mask is protective because of its relatively low etch rate compared to that of silicon.

Figure 2A:
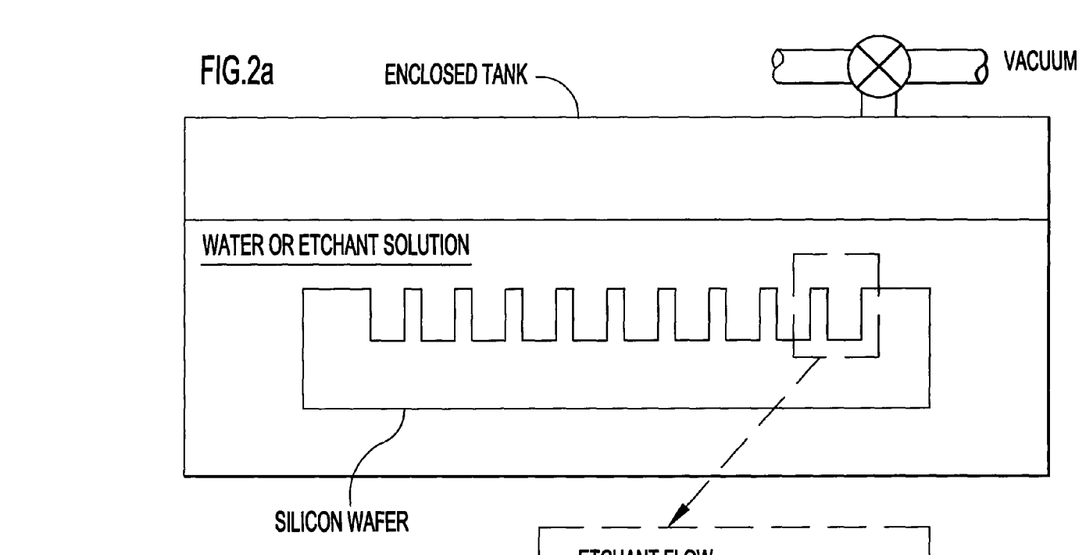
FIG. 2a is a schematic representation of the system used in the etching of deep vias.
Figure 2B:
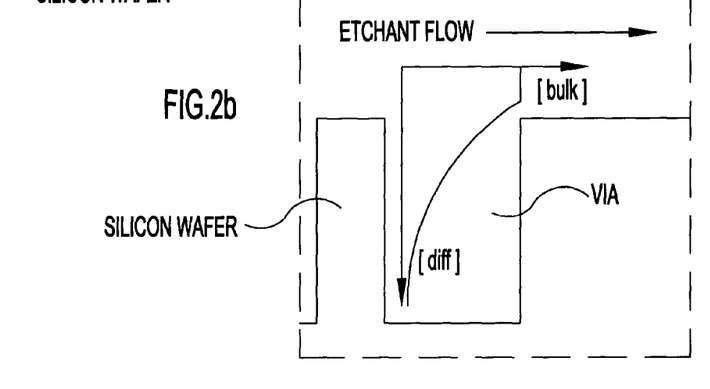
FIG. 2b is a cross sectional schematic conception of etching species within the via during etchant flow.

The etchant reacts at the silicon surface to form the charged specie $SiF_6-2$. Interior walls 10 of structure 1a are preferably pre-wet with water or with the etching solution (FIG. 2a). The etching solution is preferably agitated during etching. FIG. 2b shows the expected concentration profile of etching species based on diffusion mass transfer, species consumption rate, and momentum transfer. Hence, the lateral etching rate is greater in upper region 11 and intermediate region 12 of the FIG. 3b structure, producing a flared side wall. Angles $α_3$ and $α_4$ are controlled by the following: 1) viscosity of the etching fluid; 2) relative species depletion rate deep inside the structure; 3) the lateral and vertical definition of the structure as prescribed by lithography and deep RIE; and 4) the presence of surfactants or other additives in the etching solution to promote or impede silicon surface wetting.

The vertical side wall structure shown in FIG. 3a and more preferably, the continuous and gradually sloping side wall structure of the flared structure shown in FIG. 3b, are conducive to adequate step coverage during subsequent deposition of a material. The art describes filling such high aspect ratio structures (HARS) with a material, typically a dry conductive material as in IC interlevel connects. In the present invention, the straight-walled and the flared structures differ from conventional HARS described in the art, as vertical dimension 6 is on the order of hundreds of μm. Filling such deep structures presents unique challenges. The present invention demonstrates the feasibility of fabricating structures of these dimensions filled with a voidless conductive material. In the presently preferred embodiment, the conductive material is copper. In the presently preferred embodiment, the fill is accomplished either by blanket or selective electroplating of copper.

Metallizing Deep Vias

Figure 4A:
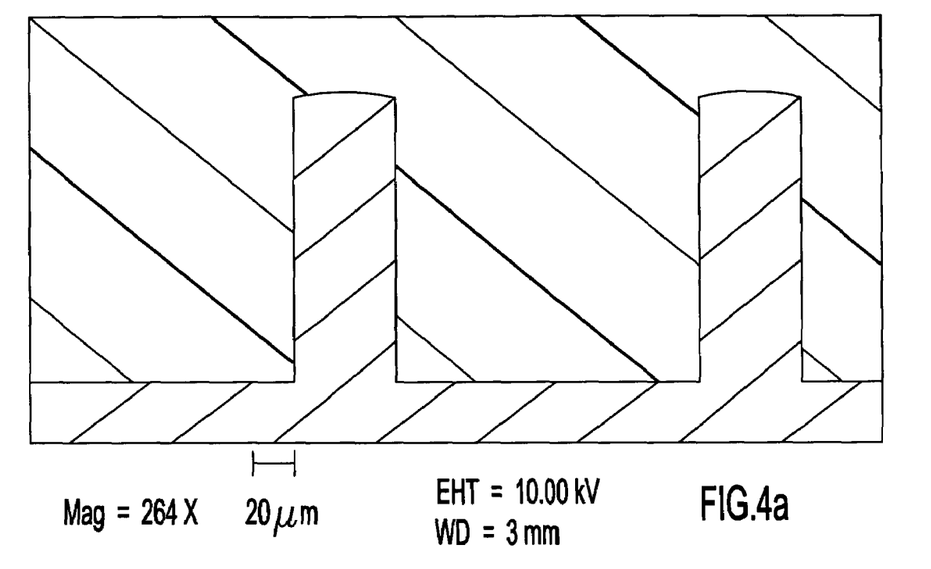
FIG. 4a shows an actual unflared deep blind via structure, represented in FIG. 3a, which was exposed to scanning electron microscopy subsequent to being metallized and diced.
Figure 4B:
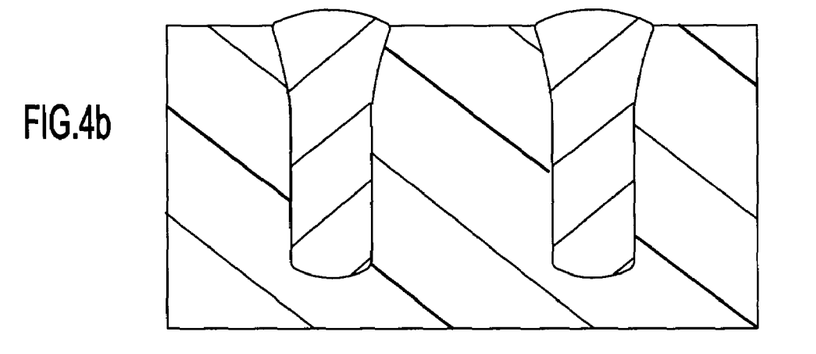
FIG. 4b shows an actual flared deep blind via structure, represented in FIG. 3b, which was exposed to scanning electron microscopy subsequent to being metallized and diced.
Figure 4C:
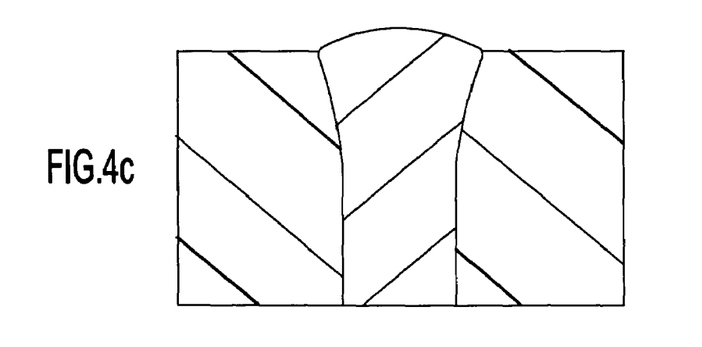
FIG. 4c shows an actual deep through-via structure, flared at the top, which was exposed to scanning electron microscopy subsequent to being metallized and diced.

FIG. 4a shows in cross-section a filled unflared blind via made by the process of the present invention which is shown schematically but unfilled in FIG. 3a. FIG. 4b shows in cross-section a filled flared blind via made by the process of the present invention which is shown schematically but unfilled in FIG. 3b. FIG. 4c shows in cross-section a filled flared through-via made by the process of the present invention.

Prior to filling the vias with conductive material, the side walls are prepared. Depending on the conductive material to be used, an oxide or nitride film may be included as a barrier layer between the silicon and the conductive material to prevent migration between the silicon side walls and the conductor. Thickness of the barrier layer can be varied as needed for a particular conductive material. Oxide films, such as silane, TEOS or thermal oxide, can be grown thermally or deposited through various means such as plasma enhanced chemical vapor deposition (PECVD). Generally the thickness of the barrier layer ranges from about 0.5 to about 2.0 μm, but can be greater, depending on the method of deposition and the need to protect the via wall from the metallization steps. Nitride films can be deposited through PECVD or LPCVD. If the conductive material is copper and the via wall is silicon, about 1000 Angstroms of barrier is preferred.

In a preferred method of preparation for the metallization steps, a liner and seed layer is deposited on top of the oxide or nitride film. The preferred liner for a plated copper metallization process is tantalum nitride and tantalum (TaN/Ta). Thickness can range from about 100 Angstroms to about 1000 Angstroms for both TaN and Ta, the preferred thickness being about 400 Angstroms for TaN and about 700 Angstroms for Ta. Thickness can be adjusted to above 100 Angstroms depending on depth of the via structure. Other liner material compatible with a plated copper metallization process can also be used, such as titanium silicon nitride (TiSiN), titanium nitride (TiN), and titanium tungsten (TiW), either alone or in combination with TaN and Ta.

Copper plating seed solution provides continuous coverage of via walls and the wafer surface. To avoid blanket coverage by the seed, a chemical metal polishing (CMP) step can be used to remove unwanted seed from flat areas of the wafer. The copper seed was sputtered on top of the tantalum of the liner to a thickness of about 5000 Angstroms.

Whenever deep vias are electroplated, there is a risk of entrapping air bubbles inside the via structure, which will result in incomplete via metallization. To prevent this from happening, after seeding, submerge the wafer in water inside an hermetically closed container connected to a vacuum line, such as the one shown in FIGS. 2a and 2b, and apply a vacuum so as to remove any entrapped air in the vias. Preferred vacuum pressure is slightly higher than the room-temperature vapor pressure of water, i.e. about 3–4 kPa, although pressures as high as about 30 kPa are useful. It may be necessary to break and reapply vacuum several times. Agitation by means such as a vibrating table is helpful in speeding up the process of removal of entrapped air in vias. Upon completion of the vacuum process, the wafer must remain wet until electroplated.

Copper electroplating of vias was performed on a fountain cup plating tool. Such a wafer plating tool is commercially available, for example, from Semitool. The electroplating solution used contained 248 g/l, cupric sulfate pentahydrate 35 g/l sulfuric acid, and 50 mg/l chloride in the form of hydrochloric acid. The electroplating additives were of the Nanoplate series supplied by Shipley Co. L.L.C. They were B-2001 at 30 ml/l, C-2001 at 25 ml/l and L-2001 at 5 ml/l. Suitable ranges for the plating solution are: about 100 to about 250 gl/l cupric sulfate pentahydrate, about 10 to about 100 g/l sulfuric acid and about 10 to about 100 mg/l chloride. Suitable ranges for the additives are: about 10 to about 45 ml/l B-2001, about 10 to about 40 ml/l C-2001 and about 0.5 to about 10 ml/l L-2001.

Plating was performed on 200 mm silicon wafers at room temperature at a current density of 5 mA/sq.cm. at a flow rate of 4.5 gal/min., with a rotation rate of 90 RPM. Suitable ranges are about 0.50 to about 10 mA/sq.cm. current density, about 2 to about 9 gal/min flow rate and about 20 to about 180 RPM.

The above examples are intended to be illustrative rather than exhaustive, and while the invention has been described in conjunction with specific embodiments under specific conditions, additional embodiments, modifications and applications will be apparent now and in the future to those skilled in the art.

We claim:

1. A process for making deep flared vias in a substrate, comprising:
   a.) providing a substrate having a first and a second surface in parallel, the first surface being coated with a masking layer;
   b.) developing with a layer of photoactive material a plurality of openings on the first surface;
   c.) dry etching vias through the masking layer to the depth desired in the substrate using TMDE while cooling the substrate, under bias, to a temperature between about 0° C. and about −100° C.; to form the deep vias; and
   d.) performing a two-stage etch process on at least one end of the deep vias, wherein the second stage of the two-stage process comprises wet etching in an HF-containing solution selected from the group consisting of:
   HF in a concentration between about 0.5–10 wt % : $HNO_3$ in a concentration between about 20–70 wt % : $H_2O$; and
   HF in a concentration between about 0.5–10 wt %. balance $H_2O$.

2. The process recited in claim 1, wherein the substrate comprises silicon.

3. The process recited in claim 2, wherein the mask is a silicon oxide.

4. The process recited in claim 1, wherein the substrate material is a wafer selected from the group consisting of silicon monoxide, silicon dioxide, silicon nitride, polysilicon, quartz, glass, silicates, silicon germanium and gallium arsenide.

5. The process recited in claim 1, wherein the bias is applied between about 180 V and about 225 V.

6. The process recited in claim 1, wherein in the first stage of the two-stage etch process is a dry etch.

7. The process recited in claim 6, wherein the first stage dry etch comprises oxygen ashing.

8. The process recited in claim 1, further comprising applying vacuum under agitation until any air is removed from the vias and is replaced by the HF-containing solution to fill the vias.

9. The process recited in claim 1, further comprising coating on the substrate, curing and exposing, the layer of photoactive material.

10. A process for making deep flared vias in a substrate, comprising:
  a.) providing a substrate having a first and a second surface in parallel, the first surface being coated with a masking layer;
  b.) developing with a layer of photoactive material a plurality of openings on the first surface;
  c.) dry etching vias through the masking layer to the depth desired in the substrate using TMDE while cooling the substrate, under bias, to a temperature between about 0° C. and about −100° C.; to form the deep vias;
  d.) performing a two-stage etch process on at least one end of the deep vias;
  e.) immersing the etched openings in a wetting solution that will not further etch the vias;
  f.) applying vacuum and agitation until any air is removed from the vias and replaced by the wetting solution to fill the vias; and
  g.) preparing the vias for plating conductive material into the vias.

11. The process recited in claim 10, wherein the vacuum applied is about 3–30 kPa.

12. The process recited in claim 10, further comprising coating on the substrate, curing and exposing, the layer of photoactive material.

13. The process recited in claim 10, wherein the substrate comprises silicon.

14. The process recited in claim 13, wherein the mask is a silicon oxide.

15. The process recited in claim 10, wherein the substrate material is a wafer selected from the group consisting of silicon monoxide, silicon dioxide, silicon nitride, polysilicon, quartz, glass, silicates, silicon germanium and gallium arsenide.

16. The process recited in claim 10, wherein the bias is applied between about 180 V and about 225 V.

* * * * *

UNITED STATES PATENT AND TRADEMARK OFFICE
CERTIFICATE OF CORRECTION

PATENT NO. : 7,060,624 B2
APPLICATION NO. : 10/639989
DATED : June 13, 2006
INVENTOR(S) : Andricacos et al.

It is certified that error appears in the above-identified patent and that said Letters Patent is hereby corrected as shown below:

Title Page, Item (75), Inventors: please add the inventor Yu-ting Cheng.

Signed and Sealed this
Twenty-fifth Day of June, 2013

Teresa Stanek Rea
*Acting Director of the United States Patent and Trademark Office*